United States Patent
Puvvada et al.

(10) Patent No.: US 7,421,634 B2
(45) Date of Patent: Sep. 2, 2008

(54) SEQUENTIAL SCAN BASED TECHNIQUES TO TEST INTERFACE BETWEEN MODULES DESIGNED TO OPERATE AT DIFFERENT FREQUENCIES

(75) Inventors: Naga Satya Srikanth Puvvada, Bangalore (IN); Nikila Krishnamoorthy, Bangalore (IN); Sandeep Jain, Rewari (IN); Jais Abraham, Kerala (IN)

(73) Assignee: Texas Instruments Incorporated, Dallas, TX (US)

( * ) Notice: Subject to any disclaimer, the term of this patent is extended or adjusted under 35 U.S.C. 154(b) by 555 days.

(21) Appl. No.: 11/160,235

(22) Filed: Jun. 15, 2005

(65) Prior Publication Data
US 2006/0248422 A1 Nov. 2, 2006

(30) Foreign Application Priority Data
May 2, 2005 (IN) .......................... 519/CHE/2005

(51) Int. Cl.
*G01R 31/28* (2006.01)
(52) U.S. Cl. ...................................... 714/731; 714/726
(58) Field of Classification Search ................. 714/726, 714/731
See application file for complete search history.

(56) References Cited

U.S. PATENT DOCUMENTS 5,909,451 A * 6/1999 Lach et al. ................. 714/726
6,442,722 B1 * 8/2002 Nadeau-Dostie et al. .... 714/731

\* cited by examiner

*Primary Examiner*—James C Kerveros
(74) *Attorney, Agent, or Firm*—Wade James Brady, III; Frederick J. Telecky, Jr.

(57) ABSTRACT

According to an aspect of present invention, modules designed to operate with different frequency in functional (normal) mode are tested using a sequential scan based technique at the respective frequencies. In one embodiment the interface logic connecting the two modules is tested for at-speed performance (i.e., the same speed at which the interface would be operated in functional mode during normal operation).

12 Claims, 5 Drawing Sheets

SEQUENTIAL SCAN BASED TECHNIQUES TO TEST INTERFACE BETWEEN MODULES DESIGNED TO OPERATE AT DIFFERENT FREQUENCIES

BACKGROUND OF THE INVENTION

1. Field of the Invention

The present invention relates to testing of integrated circuits using sequential scan based techniques, and more specifically to a method and apparatus for testing interface between modules designed to operate at different clock frequencies.

2. Related Art

Sequential scan techniques are often used to test integrated circuits. According to a typical sequential scan technique, integrated circuits are designed to operate in functional mode or test mode. In functional mode, elements in the integrated circuit are connected according to a desired design and to provide a desired utility for which the integrated circuit is primarily designed.

In test mode, the integrated circuit is designed to connect various memory elements (contained in the integrated circuit) such as flip-flops in a sequence referred to as a "scan chain" (i.e., the output of one element is connected as an input to the next element). The first element in the scan chain is generally designed to receive the input bits and the last element of the scan chain is designed to scan out the results of evaluation, as described below.

In a typical scan test scenario, a number of bits in a particular pattern of zeros and ones (scan vector) are sequentially (one bit at every clock cycle) loaded (scanned in) into a scan chain through the first element. The number of bits contained in the scan vector generally equals the number of memory elements in a corresponding scan chain.

Once a scan chain is loaded with a scan vector, the elements (generally the combinatorial logic) in the integrated circuit are evaluated by connecting the elements in the integrated circuit according to the connections defined for functional mode of operation. The integrated circuit is operated generally for one clock cycle similar to in the functional mode and the corresponding duration may be termed as the evaluation phase. Based on the scanned in bits, the flip-flops latches the results of the functional mode operation of one clock pulse.

The connection is then reverted back to the test mode, and the bits latched are sequentially scanned out (one bit at every clock cycle) through the last element in the scan chain. The received scan out is compared with an expected scan out corresponding to the scan vector to determine the various faults within the integrated circuit.

There is a general need to use such scan techniques even in situations when an integrated circuit (device or system) contains multiple modules. Modules generally refer to distinct units, typically provided for a specific purpose. For example, a module may operate as a random access memory, and another module may be implemented to process analog signals according to desired digital signal processing (DSP) techniques.

It is desirable that to test the inter-module operation, generally when one module is designed to provide a signal to another module. The modules are generally said to be connected by interface logic, which can be a combinatorial circuit (performing a logical operation), a straight metal path connecting the modules, etc.

Testing of inter-module operation is known to present challenges, particularly when the modules are designed to operate at different clock frequencies in functional mode. In one prior approach, each module is tested separately at a corresponding clock frequency only. Thus, each module is tested individually, but inter-module operation may not be at least adequately tested.

In another prior approach, the two modules are tested together, but using a common clock frequency. As a result, the accuracy of logic of inter-module operation may be tested. However, such an approach may not test the inter-module operation for any faults related merely to timing. For example, the prior approach may not test for transition faults. A transition fault is generally said to be present if a node fails to transition from one logical value to another logical value in a desired time interval (determined by the frequency of operation of the clock).

Hence what is generally needed is a method and apparatus for testing interface between modules designed to operate at different clock frequencies.

BRIEF DESCRIPTION OF THE DRAWINGS

Various features of the present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

An aspect of the present invention simultaneously (concurrently) tests two modules at different clock frequencies equaling the respective operating clock frequencies of the modules in the functional mode. In an embodiment in which a first module provides an output to a second module on an interface, the output is transferred (during testing) from the first module to the second module on the interface at a speed equaling the speed at which the outputs would be transferred in functional mode.

Such features are supported by appropriate design of a first clock signal and a second clock signal used with the first module and second module during testing. The timing of the clock signals is controlled to generate a second latch edge of the first clock signal and a second latch edge of the second clock signal to be synchronous in the evaluation phase, while controlling the clock duration to equal the inverse of the respective clock frequency just prior to the respective synchronous edge.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Environment

Figure 1:
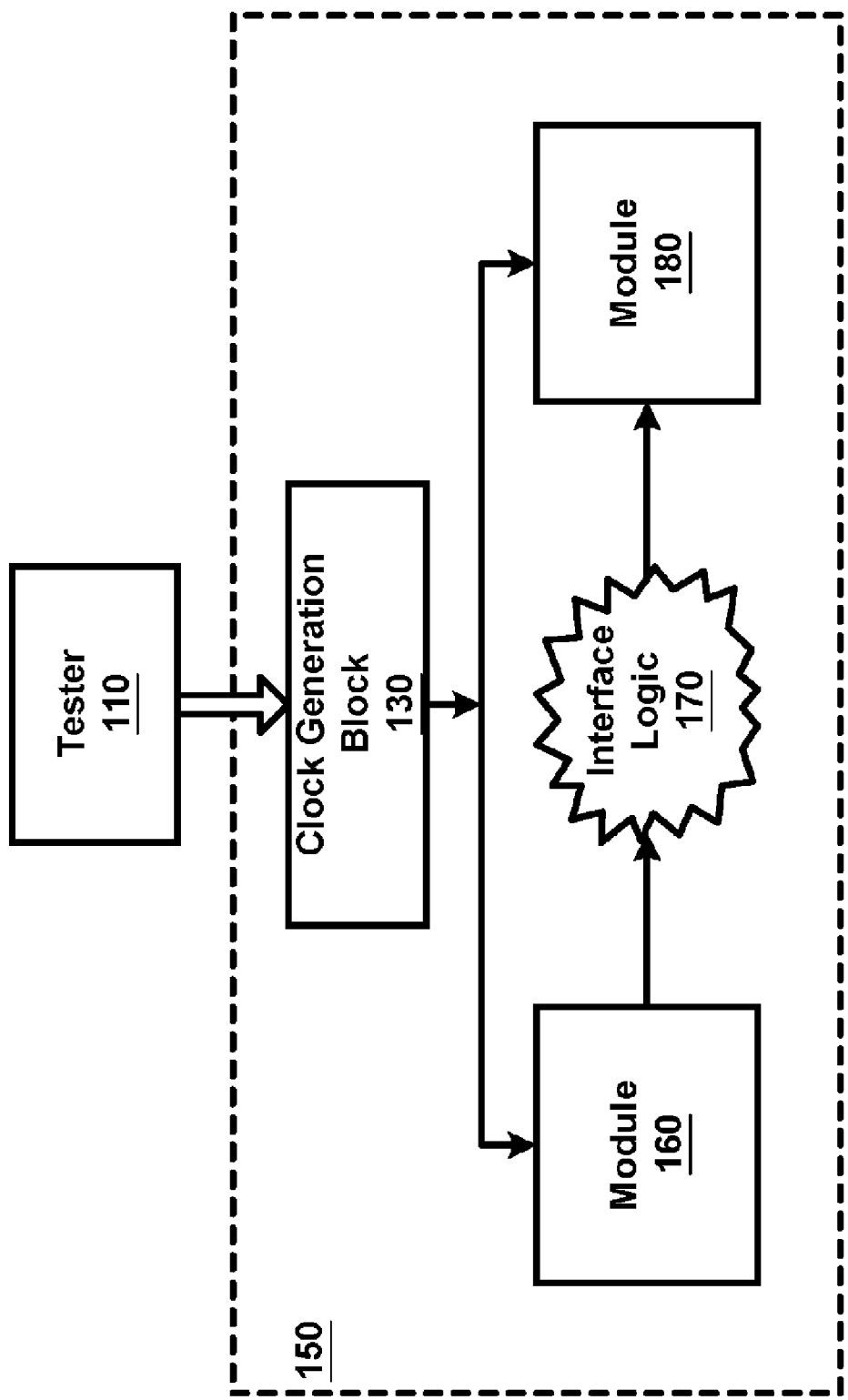
FIG. 1 is a block diagram of illustrating an example environment in which several aspects of the present invention can be implemented

FIG. 1 is a block diagram of illustrating an example environment in which several aspects of the present invention can be implemented. The block diagram is shown containing tester 110 and integrated circuit (IC)150. IC 150 in turn is shown containing modules 160 and 180, interface logic 170 and clock generation circuit 130. Each block is described below in further detail.

Modules 160 and 180 are designed for operation at different clock frequencies in functional mode, and are shown connected by interface logic 170. Interface logic 170 is assumed to contain combinatorial logic only. The logic performs a corresponding logical operation on inputs received from module 160 and provides the resulting output to module 180.

Tester 110 provides scan vectors (and various control signals) used for testing integrated circuit 150 using sequential scan techniques. The scan vectors can be generated using techniques such as combinational Automatic test pattern generation (ATPG) well known in the relevant arts. Scan vectors are scanned into modules 160 and 180 using different scan chains. Tester 110 operates in conjunction with clock generation circuit 130 to facilitate inter-module testing of modules 160 and 180 using sequential scan techniques as described below in further detail.

Clock generation circuit 130 receives a source clock signal from tester 110 and generates clock signals for modules 160 and 180 to cause inter-module testing to be performed at the same clock speed as at which the data would be transferred between the modules in functional mode. Though shown in IC 150, clock generation circuit 130 can be implemented in tester 110 as well.

The operation and implementation of clock generation circuit will be clearer based on the manner in which inter-module testing is performed according to various aspects of the present invention, as described below in further detail.

3. Inter-Module Testing

Figure 2:
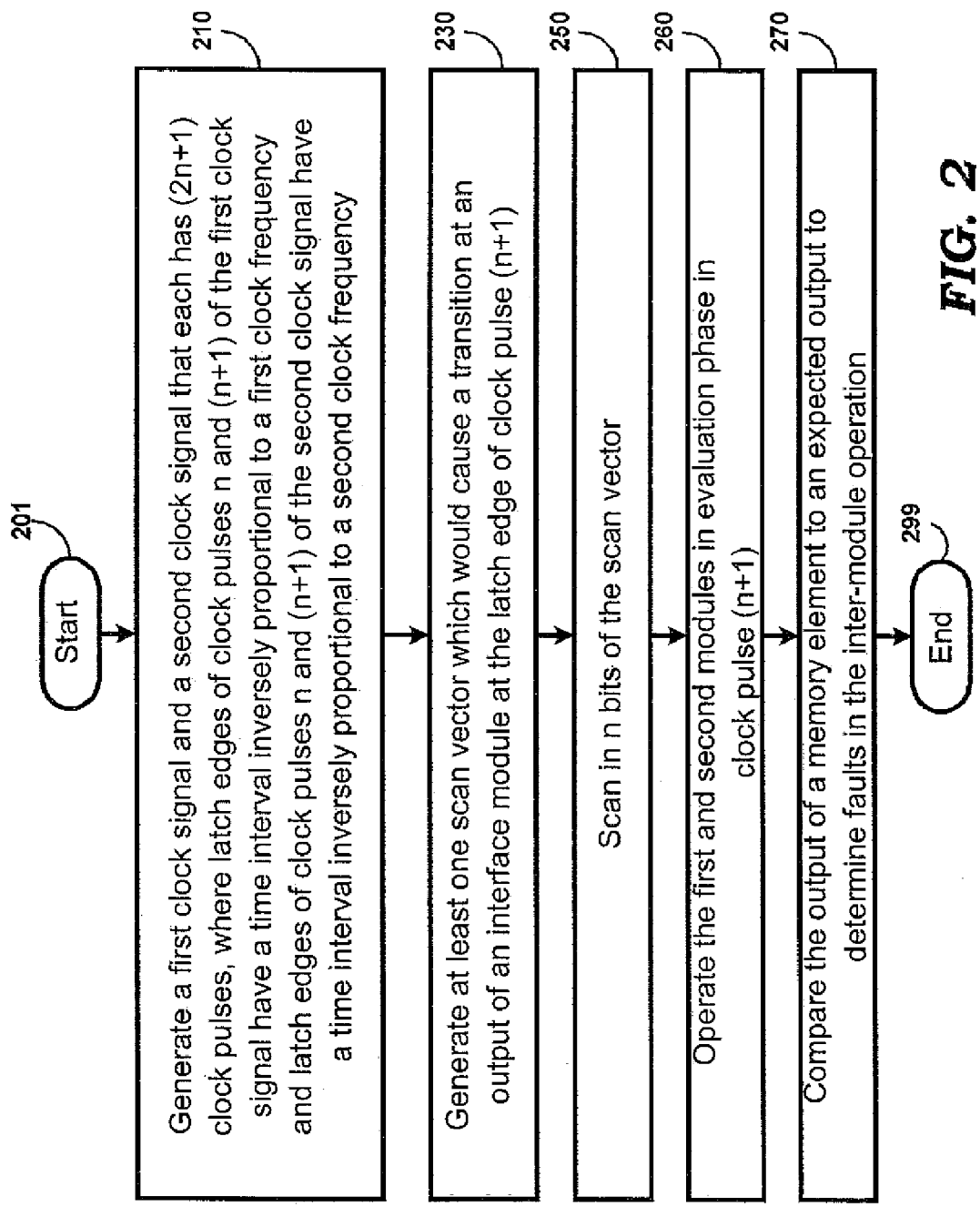
FIG. 2 is a flow chart illustrating an approach for inter-module testing according to an aspect of the present invention.

FIG. 2 is a flow chart illustrating an approach for inter-module testing according to various aspect of present invention. The flowchart is described with reference to FIG. 1 for illustration. However, the approaches can be implemented in other environments as well without departing from the scope and spirit of various aspects of the present invention, as will be apparent to one skilled in the relevant arts by reading the disclosure provided herein. Also, for illustration, it is assumed that a scan vectors of n-bits is used in testing. The flowchart begins in step 201 and control immediately passes to step 210.

In step 210, clock generation circuit 130 generates a first clock signal and a second clock signal, each having 2n+1 clock pulses with corresponding latch edges. The latch edges of n and n+1 clock cycles of the first clock signal are designed with a time interval proportionate to reciprocal value of the first clock frequency, and the latch edges of n and n+1 clock cycles of the second clock signal are designed with a time interval proportionate to reciprocal value of the second clock frequency. In addition, the (n+1)st latch edge of the first clock signal and second clock signal are synchronized. The first n−1 and last n+1 latch edges may also be synchronized.

In step 230, tester 110 generates scan vector(s) which would cause a transition at the output of the interface module as well as at the input of a memory element (receiving the output from the first module via the interface module) in the second module at the (n+1)st latch edge. It may be appreciated that inter-module testing entails successful transfer of a transition from one module to the other, and this transition needs to be successfully latched by the receiving module. Confirmation of both these events could require using vectors according to step 230. Such scan vectors can be generated in a known way using techniques such as combinational Automatic test pattern generation (ATPG).

In step 250, clock generation circuit 130 (responsive to source clock received from tester 110) causes the first n bits of the scan vector to be scanned in (to integrated circuit 150). The first clock signal may be used for clocking the memory elements in the first module and the second clock signal for the second module for the scan-in operation.

In step 260, tester 110 (in conjunction with clock generation circuit 130 in the described embodiment) operates the two modules in evaluation phase in the (n+1)st clock pulse using the corresponding clock signals. The evaluation causes IC 150 to operate as if in functional mode, but starting from the state caused by the scanning in of the N-bits, during the one clock pulse.

In step 270, the output of the memory element is compared with an expected output to determine any faults in the inter-module operation. Tester 110 may scan out the n-bits and then compare with corresponding expected bits to determine the presence of any faults. The flowchart ends in step 299.

Thus, inter-module testing is performed by having clock generation circuit 130 generate and provide the two clock signals noted above. In addition, the inter-module interface is tested for "at-speed" (i.e., at the same speed as the data transfers would occur in functional mode during normal operation) performance, as described below in further detail.

4. Timing Diagram

Figure 3:
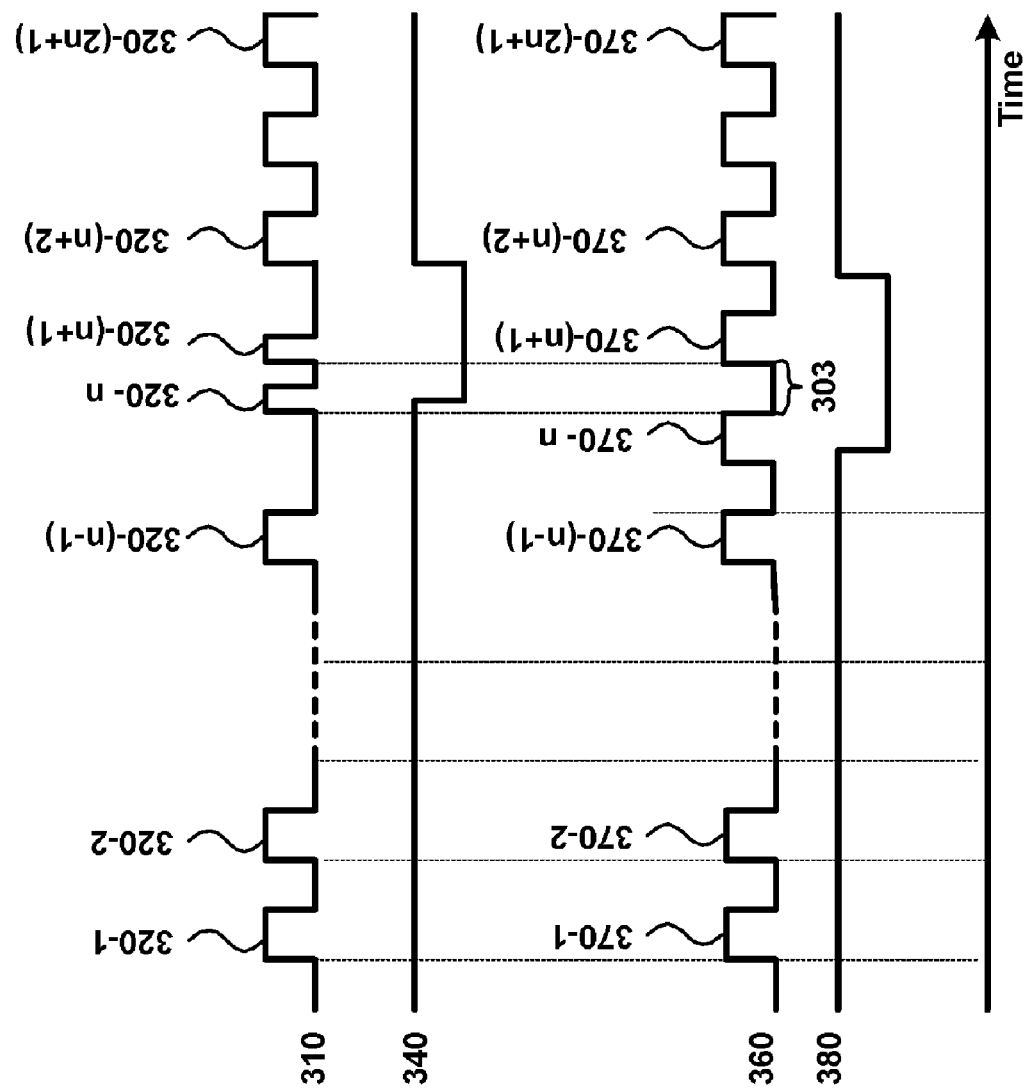
FIG. 3 is a timing diagram illustrating the relationship between various signals in an embodiment of the present invention.

FIG. 3 is a timing diagram illustrating the first clock signal and second cock signal generated in one embodiment. The timing diagram is shown containing first clock signal 310 (clocking module 160), second clock signal 360 (clocking module 180), first scan enable 340 (specifying the transitions in/out of evaluation mode for module 160) and second scan enable 380 (for module 180).

For illustration, it is assumed that the memory elements of the modules are designed for latching on the rising edges of the corresponding clock signals and also that the entire timing diagram relates to test mode. Similarly, the first clock signal is assumed to have twice (rational number conveniently) the frequency of the second clock signal in functional mode, and thus the inter-module testing is to be performed in a corresponding situation.

Scan line 340 indicates whether module 160 is operated in scan mode (on logic high) or in evaluation mode (logic low). Scan line is shown going low after the rising edge of pulse 320-n, an thus module operates in "scan in" mode until that point. Module 160 operates in scan out mode after the rising edge of scan line 340. Similarly, scan line 380 causes module 180 to operate in scan in mode until after the rising edge of pulse 370-n, and in scan out mode starting from the rising edge of pulse 370-(n+2). In between the scan in mode and scan out mode, inter-modules are tested at-speed in testing duration 303, as described below.

First clock signal 310 (clocking module 160) is shown containing pulses 320-1 through 320-(2n+1) and second clock signal 360 (corresponding to module 180) is shown containing pulses 370-1 through 370-(2n+1). The latch (rising) edges of clock pulses 320-1 through 320-(n−1) are synchronous (occurring at same time instance/point) with corresponding edges of clock pulses 370-1 through 370-(n−1). Similarly, the latch edges of clock pulses 320-(n+1) through 320-(2n+1) are synchronous with corresponding edges of pulses 370-(n+1) through 370-(2n+1).

The time duration between two successive latch edges in scan-in and scan-out durations needs to be long enough to permit scanning in the slowest module. In an embodiment, the duration is selected to be greater than or equal to the reciprocal of the lowest clock frequency among the different clock frequencies used for modules in functional mode.

With respect to testing duration, as noted above, the rising edge of pulse 320-(n+1) is synchronous with rising edge of 370-(n+1). Once the edges are thus fixed, the time duration between the rising edge of pulse 320-(n) to the rising edge of 320-(n+1) is set equal to the reciprocal of functional clock frequency of module 160. Similarly, time duration between the latch edge of pulse 370-n and the latch edge of the pulse 370-(n+1) is set to reciprocal of corresponding functional clock frequency of module 180.

Due to use of clock signals generated according to the description provided above, module 160 receives two successive clock pulses (320-n and 320-(n+1)) at frequency equal to the frequency at which the module 160 is designed to operate in functional mode. As a result, module 160 is effectively tested at the designed frequency of operation (i.e., frequency in the functional mode during normal operation).

Similarly pulses (370-n and 370-(n+1)) effectively tests the module 180 at the corresponding designed frequency of operation. The clock signals thus used also test interface logic 170 at "at-speed performance" as described below with respect to the relevant details of internals of modules 160 and 180.

5. Circuit Diagram

Figure 4:
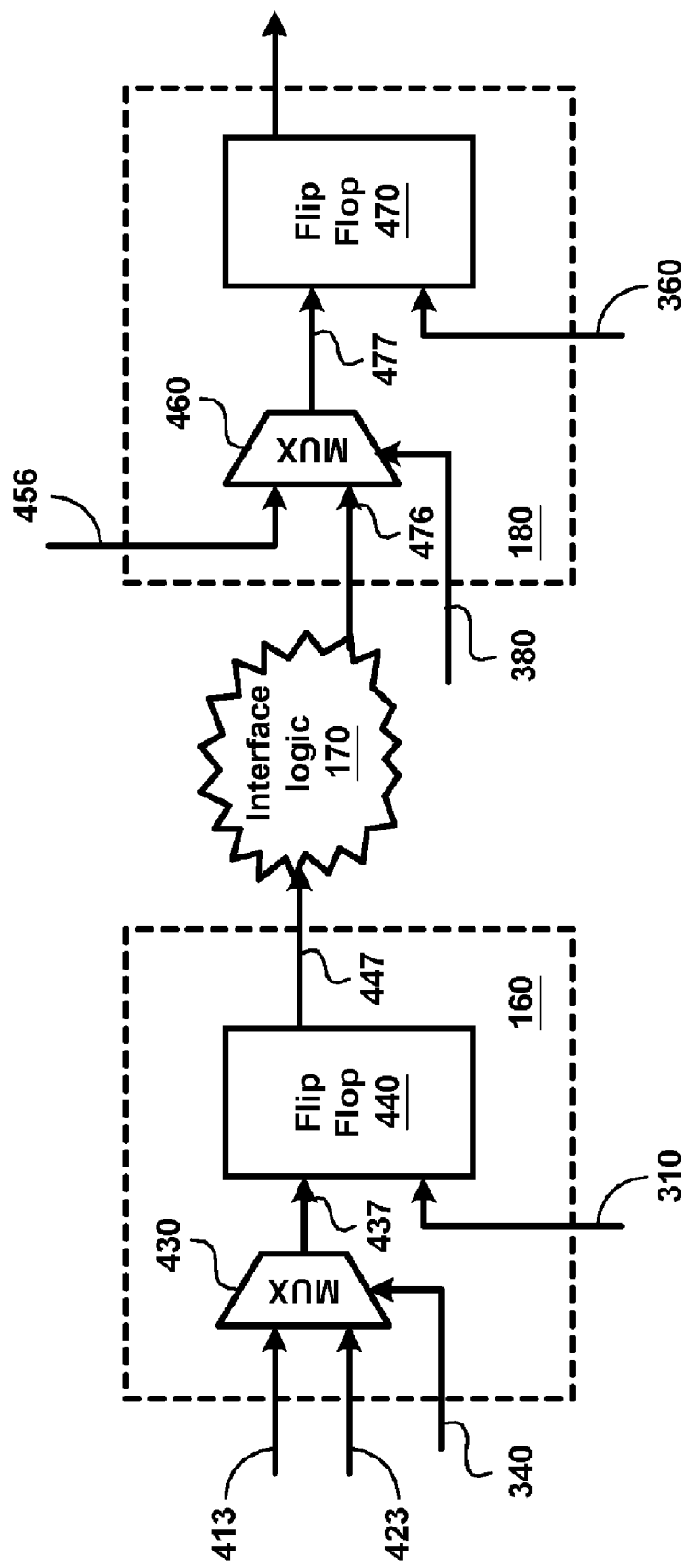
FIG. 4 is a circuit diagram containing relevant portions of the modules, illustrating the manner in which inter-module testing is performed at-speed in an embodiment of the present invention.

FIG. 4 is a circuit diagram illustrating manner in which interface logic 170 transferring data from module 160 and module 180 are tested at-speed. The block diagram is shown containing modules 160, 180 and interface logic 170. For conciseness and clarity of understanding, module 160 is shown containing only a single multiplexer 430 and a single flip flop 440, even though typical modules would contain many such pairs. Similarly module 180 is shown containing a multiplexer 460 and a flip flop 470. Each component is described below in further detail.

Multiplexer 430 selects the data from path 413 or path 423 depending on the logic level of scan enable signal 340. It is assumed that path 413 is part of a scan chain and is selected on logic high of scan enable signal 340, and thus flip-flop 440 forms part of a scan chain when scan enable 340 is high. On the other hand, path 423 is assumed to be connected to the functional input as in normal/functional mode of operation. Flip-flop 440 is shown clocked by clock signal 310.

The operation of flip-flop 470 and multiplexer 460 is similarly explained, except that the select path of multiplexer 460 is connected to scan enable signal 380 and flip-flop 460 is clocked by clock signal 360. The scan chain input is received on path 456 and functional input on path 476.

Interface logic 170 receives an output from the flip flop 440 and performs various logical operations. The result of the logic operations is provided as input to multiplexer 460 on the logic 0 terminal (476). The manner in which interface logic 170 is tested at-speed, is described below with combined reference to FIG. 3.

The first (n−1) bits are scanned into flip flops 440 and 470 in "scan-in duration" by having both scan enable signals 340 and 380 at logic 1 during the first n−1 pulses. The n th bit of the corresponding scan vector is scanned into flip flop 470 on the rising edge of 370-n pulse. It may be appreciated that the scanning has the effect of initializing both flip-flops 440 and 470 to the same logical value. Second scan enable signal 380 is thereafter made logic 0, and thus flip-lop 470 is ready for operation in evaluation mode.

Now with respect to duration 303, it is noted that the nth bit is scanned into flip-flop 440 on the rising edge of pulse 320-n. Immediately thereafter, scan enable 340 is set to logic low, and thus flip-flop 440 is ready for operation in evaluation mode. On the rising edge of pulse 370-(n+1), flip-flop 470 latches the next input (resulting from the evaluation mode, which is akin to the functional mode). The evaluation causes a transition at the output of flip-flop 440, which is transferred as an input to flip-flop 470 (due to the functional mode of operation).

Since the rising edge of pulse 370-(n+1) is synchronous with the rising edge of pulse 320-(n+1), the total duration available for evaluation and latching (the transition) in flip-flop 470 equals one clock period of clock signal 310 (or half clock period of clock signal 360) since the clock signal has been generated as such according to step 210. Such time duration equals an at-speed performance during functional mode. Accordingly, interface logic 170 is tested for at speed performance, as desired.

The description is continued with respect to the manner in which the clock signals are generated in an embodiment of the present invention.

6. Clock Signal Generation

Figure 5:
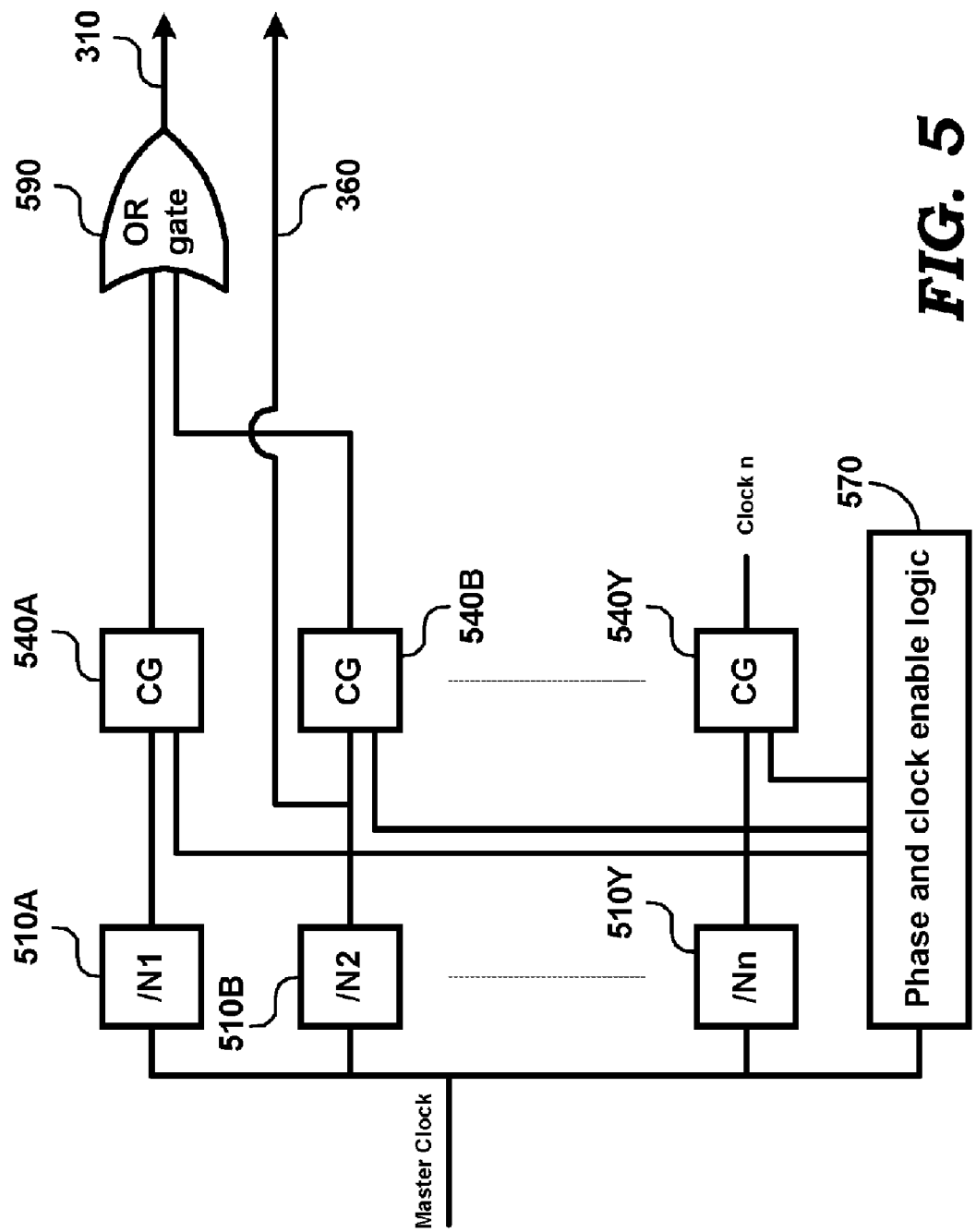
FIG. 5 is block diagram illustrating manner in which n th and (n+1)st clock pulses are generated corresponding to different modules designed to operate at different clock frequencies in functional mode.

FIG. 5 is block diagram illustrating manner in which various clock signals of interest can be generated. The block diagram is shown containing frequency dividers 510A-510Y, clock gating (CG) circuits 540A-540Y, OR gate 590 and phase and clock enable logic 570.

Frequency dividers 510A-Y divides a master clock (received from tester 110 in one embodiment) with respective divisor values N1, N2, etc., to generate corresponding clock signals clock1, clock2, etc. For illustration, it is assumed that the master clock is received with a frequency of 4x, first clock signal 310 in functional mode (and thus for pulses 320-n and 320-(n+1)) is to be at a frequency of 2x, and the first clock signal 310 and second clock signal 360 otherwise need to be at frequency of x. Accordingly, it is assumed that N1 equals 2 and N2 equals 4.

The output from divider 510B is provided as clock signal 360. Phase and clock enable logic 570 controls CG circuits 540A and 540B to cause clock signal 310 to be generated as the output of OR gate 590. To obtain the clock signal, phase and clock enable logic 570 enables CG circuit 540A in time durations pulses 320-n and 320-(n+1) are to be generated, and enables CG circuit CG 540B in other times. As a result, the output of OR gate 590 represents clock signal 310. Any other desired clock signals can be generated using similar approaches.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of testing an integrated circuit having first and second modules and an interface module, the first module being designed to operate at a first clock frequency in a functional mode and has an output connected to an input of the interface module, the second module being designed to operate at a second clock frequency in the functional mode and has an input connected to an output of the interface module, wherein the first clock frequency is not equal to the second clock frequency, the method comprising:

providing a first clock signal to the first module and a second clock signal to the second module, each of the first and second clock signals having (2n+1) clock pulses with corresponding latch edges, wherein n is an integer greater than 1;

clock pulses number 1 to number (n−1) of the first and second clock signals have synchronized corresponding latch edges;

the latch edges of clock pulses number n and number (n+1) of the first clock signal have a time interval inversely proportional to the first clock frequency, the latch edges of clock pulses number n and number (n+1) of the second clock signal have a time interval inversely proportional to the second clock frequency, where the latch edges of the clock pulse number (n+1) of the first and second clock signals are synchronized; and clock pulses number (n+2) to number (2n+1) of the first and second clock signals have synchronized corresponding latch edges;

clocking n bits of a scan vector into the first and second modules using the clock pulses number 1 to number n of a corresponding one of the first and second clock signals, wherein the scan vector has at least n bits;

operating the first and second modules in the functional mode for the duration of the clock pulse number (n+1) of the corresponding one of the first and second clock signals, wherein the scan vector causes a transition at the output of the interface module at the latch edge of the clock pulse number (n+1) of one of the first and second clock signals; and clocking an n-bit vector from the second module using the clock pulses number (n+2) to number (2n+1) of the second clock signal.

2. The method of claim 1, wherein the interface module comprises only combinatorial logic.

3. The method of claim 2, wherein a ratio of the first clock frequency and the second clock frequency is an integer greater than one.

4. The method of claim 1, further comprising:

comparing the n-bit vector to an expected vector to determine a fault in one of the first module, the second module, and the interface module.

5. An integrated circuit comprising:

a first module designed to operate at a first clock frequency in a functional mode and has an output connected to an input of an interface module;

a second module designed to operate at a second clock frequency in the functional mode and has an input connected to an output of the interface module, wherein the first clock frequency is not equal to the second clock frequency;

a clock generation circuit providing a first clock signal to the first module and a second clock signal to the second module, each of the first and second clock signals having (2n+1) clock pulses with corresponding latch edges, wherein n is an integer greater than 1;

clock pulses number 1 to number (n−1) of the first and second clock signals have synchronized corresponding latch edges;

the latch edges of clock pulses number n and number (n+1) of the first clock signal have a time interval inversely proportional to the first clock frequency, the latch edges of clock pulses number n and number (n+1) of the second clock signal have a time interval inversely proportional to the second clock frequency, where the latch edges of the clock pulse number (n+1) of the first and second clock signals are synchronized; and clock pulses number (n+2) to number (2n+1) of the first and second clock signals have synchronized corresponding latch edges;

a scanning-in circuit clocking n bits of a scan vector into the first and second modules using the clock pulses number 1 to number n of a corresponding one of the first and second clock signals, wherein the scan vector has at least n bits;

a testing circuit operating the first and second modules in the functional mode for the duration of the clock pulse number (n+1) of the corresponding one of the first and second clock signals, wherein the scan vector causes a transition at the output of the interface module at the latch edge of the clock pulse number (n+1) of one of the first and second clock signals; and a scanning-out circuit clocking an n-bit vector from the second module using the clock pulses number (n+2) to number (2n+1) of the second clock signal.

6. The integrated circuit of claim 5, wherein the interface module comprises only combinatorial logic.

7. The integrated circuit of claim 6, wherein a ratio of the first clock frequency and the second clock frequency is an integer greater than one.

8. The integrated circuit of claim 5, further comprising:

a fault determination circuit comparing the n-bit vector to an expected vector to determine a fault in one of the first module, the second module, and the interface module.

9. A clock generation circuit facilitating testing of a first module, an interface module, and a second module using a sequential scan approach, the first module designed to operate at a first clock frequency in a functional mode and has an output connected to an input of the interface module, the second module designed to operate at a second clock frequency in the functional mode and has an input connected to an output of the interface module, wherein the first clock frequency is not equal to the second clock frequency, the clock generation circuit comprising:

means for providing a first clock signal to the first module and a second clock signal to the second module, each of the first and second clock signals having (2n+1) clock pulses with corresponding latch edges, wherein n is an integer greater than 1;

clock pulses number 1 to number (n−1) of the first and second clock signals have synchronized corresponding latch edges and are used to clock n bits of a scan vector having at least n bits into a corresponding one of the first and second modules;

the latch edges of clock pulses number n and number (n+1) of the first clock signal have a time interval inversely proportional to the first clock frequency, the latch edges of clock pulses number n and number (n+1) of the second clock signal have a time interval inversely proportional to the second clock frequency, where the latch edges of the clock pulse number (n+1) of the first and second clock signals are synchronized;

clock pulses number (n+2) to number (2n+1) of the first and second clock signals have synchronized corresponding latch edges and the clock pulses number (n+2) to number (2n+1) of the second clock signal are used to clock an n-bit vector from the second module; and the first and second modules are operated in the functional mode for the duration of the clock pulse number (n+1) of the corresponding one of the first and second clock signals, where the scan vector causes a transition at the output of the interface module at the latch edge of the clock pulse number (n+1) of one of the first and second clock signals.

10. The clock generation circuit of claim 9, wherein the interface module comprises only combinatorial logic.

11. The clock generation circuit of claim 10, wherein a ratio of the first clock frequency and the second clock frequency is an integer greater than one.

12. The clock generation circuit of claim 9, further comprising:

means for comparing the n-bit vector to an expected vector to determine a fault in one of the first module, the second module, and the interface module.

* * * * *